United States Patent
Kim et al.

(10) Patent No.: US 8,785,940 B2
(45) Date of Patent: Jul. 22, 2014

(54) ORGANIC LIGHT-EMITTING DISPLAY APPARATUS AND METHOD OF MANUFACTURING THE SAME

(75) Inventors: Jong-Yun Kim, Yongin (KR); Il-Jeong Lee, Yongin (KR); Young-Dae Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/238,928

(22) Filed: Sep. 21, 2011

(65) Prior Publication Data

US 2012/0292621 A1 Nov. 22, 2012

(30) Foreign Application Priority Data

May 16, 2011 (KR) .......................... 10-2011-0045684

(51) Int. Cl.
   *H01L 27/12* (2006.01)
(52) U.S. Cl.
   USPC ............ 257/72; 257/40; 257/59; 257/E25.02; 257/E21.022; 257/E51.018; 438/34; 438/35; 438/99
(58) Field of Classification Search
   USPC .......... 257/59, 72, 336, 347, E21.703, 40, 88, 257/E25.02, E51.022, E51.018; 438/34, 35, 438/99
   See application file for complete search history.

(56) References Cited

U.S. PATENT DOCUMENTS

| 6,274,886 | B1* | 8/2001 | Sasaki et al. ..................... 257/72 |
| 2005/0045882 | A1* | 3/2005 | Park et al. ...................... 257/59 |
| 2005/0269946 | A1 | 12/2005 | Jeong et al. |
| 2006/0060838 | A1* | 3/2006 | Kang et al. ...................... 257/40 |
| 2008/0111494 | A1* | 5/2008 | Kim ............................ 315/169.3 |
| 2010/0007271 | A1* | 1/2010 | Lee et al. ....................... 313/504 |
| 2011/0075078 | A1* | 3/2011 | Cho et al. ...................... 349/108 |

FOREIGN PATENT DOCUMENTS

| KR | 10-2004-0037889 | 5/2004 |
| KR | 10-2005-0023014 | 3/2005 |
| KR | 10-2005-0115173 | 12/2005 |
| KR | 10-2006-0001377 | 1/2006 |
| KR | 10-2007-0055908 | 5/2007 |

* cited by examiner

*Primary Examiner* — Robert Huber
(74) *Attorney, Agent, or Firm* — Robert E. Bushnell, Esq.

(57) ABSTRACT

An organic light-emitting display apparatus may include: a planarization layer disposed on a substrate and covering a plurality of thin film transistors; pixel electrodes, each comprising a light emission portion and anon-light emission portion, the light emission portion being arranged on the planarization layer in a first grid pattern; via-holes, each connecting one thin film transistor and one pixel electrode through the planarization layer, and arranged in a second grid pattern offset from the first grid pattern; dummy via-holes spaced apart from the via-holes; a pixel-defining layer (PDL) disposed on the planarization layer and covering the via-holes, the dummy via-holes, and the non-light emission portion of the pixel electrodes; an organic layer disposed on the light emission portion and comprising an emissive layer; and an opposite electrode disposed on the organic layer.

21 Claims, 8 Drawing Sheets

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on May 16, 2011 and there duly assigned Serial No. 10-2011-0045684.

BACKGROUND OF THE INVENTION

1. Field of the Invention

The present invention relates to organic light-emitting display apparatuses and methods of manufacturing the same, and more particularly, to active matrix (AM) type organic light-emitting display apparatuses and methods of manufacturing the same.

2. Description of the Related Art

Organic light-emitting display apparatuses are display apparatuses in which an organic layer, including an emissive layer, is interposed between a pixel electrode and an opposite electrode. The organic light-emitting display apparatuses are self-emissive display apparatuses in which a voltage is applied to the pixel electrode and the opposite electrode, and in which holes injected from the pixel electrode and electrons injected from the opposite electrode recombine in the emissive layer so as to emit light.

The organic light-emitting display apparatuses are classified into active matrix (AM) type and passive matrix (PM) type organic light-emitting display apparatuses according to the driving method thereof. However, among them, the AM type organic light-emitting display apparatuses are widely used due to a high display quality.

In the AM type organic light-emitting display apparatuses, a thin film transistor (TFT) and a pixel electrode formed on a substrate are electrically connected to each other via a via-hole. Also, a pixel-defining layer (PDL) surrounds edges of each pixel electrode, and an emissive layer is formed on a portion of the pixel electrode exposed by the PDL so as to define a pixel area through which light is emitted.

SUMMARY OF THE INVENTION

One or more embodiments of the present invention provide organic light-emitting display apparatuses in which a collapse of the thickness of a pixel-defining layer (PDL) surrounding edges of a pixel electrode is prevented, and which may comprise a thin PDL, thereby improving display quality.

The present invention also provides a method of manufacturing the organic light-emitting display apparatuses.

According to an aspect of the present invention, an organic light-emitting display apparatus may include a planarization layer covering a plurality of thin film transistors formed on a substrate; a plurality of pixel electrodes, each comprising a light emission portion and a non-light emission portion, wherein the light emission portion is arranged on the planarization layer in a first grid pattern; a plurality of via-holes arranged in a second grid pattern which is offset from the first grid pattern, each of the via-holes connecting one of the thin film transistors and one of the pixel electrodes through the planarization layer; a plurality of dummy via-holes respectively spaced apart from the plurality of via-holes; a pixel-defining layer (PDL) formed on the planarization layer so as to cover the via-holes, the dummy via-holes, and the non-light emission portion of the pixel electrodes; an organic layer disposed on the light emission portion and comprising an emissive layer; and an opposite electrode disposed on the organic layer.

The dummy via-holes may be disposed outside an area where the pixel electrodes are formed.

The dummy via-holes may be arranged in a third grid pattern which is offset from the first grid pattern.

A first axis of the third grid pattern and a first axis of the second grid pattern may be formed on the same axis, and a second axis of the third grid pattern and a second axis of the second grid pattern may be offset.

The dummy via-holes may comprise a groove portion which is etched in the planarization layer.

The via-holes may be disposed in the non-light emission portion of the pixel electrodes.

The height of a surface of the pixel-defining layers formed on the via-holes with respect to the substrate may be lower than the height of a surface of the pixel electrodes formed in the light emission portion with respect to the substrate.

The pixel-defining layer may comprise an organic insulation material.

A thickness of the pixel-defining layer may be from 500 Å to 2000 Å.

The pixel-defining layer may be substantially planar except in an area covering the via-holes and the dummy via-holes.

Respective distances between the light emission portion and the via-holes and the dummy via-holes which are most adjacent to the light emission portion may be substantially the same.

According to another aspect of the present invention, an organic light-emitting display apparatus may include a planarization layer covering a plurality of thin film transistors; a plurality of via-holes comprising a groove portion which is formed by etching the planarization layer and a plurality of dummy via-holes which are spaced apart from the via-holes; a plurality of pixel electrodes, each comprising a light emission portion and a non-light emission portion, wherein the pixel electrodes are connected to one of the plurality of thin film transistors via the via-holes, and a via-hole area including a pair of via-holes and a dummy via-hole which are closest to each other is disposed at a distance furthest from the light emission portion of each of the plurality of pixel electrodes which are adjacent to the via-hole area; a pixel-defining layer formed on the planarization layer so as to cover the via-holes, the dummy via-holes, and the non-light emission portion of the pixel electrodes; an organic layer disposed on the light emission portion and comprising an emissive layer; and an opposite electrode disposed on the organic layer.

The light emission portion of the pixel electrodes may be arranged in a first grid pattern on the planarization layer, and the via-hole area may have an arrangement which is offset from the first grid pattern.

The via-hole area may be disposed between the light emission portions which are diagonally adjacent to one another.

A center of the via-hole area may be disposed at a point of intersection between the diagonally adjacent light emission portions.

The via-holes may be disposed in the non-light emission portions of the pixel electrodes, and the dummy via-holes may be disposed outside an area where the pixel electrodes are disposed.

According to another aspect of the present invention, a method of manufacturing an organic light-emitting display apparatus may include preparing an acceptor substrate on which a planarization layer covering a plurality of thin film transistors is disposed; a plurality of pixel electrodes, each comprising a light emission portion and a non-light emission portion, wherein the light emission portion is arranged on the planarization layer in a first grid pattern; providing a plurality of via-holes, each of which connects one of the plurality of thin film transistors and one of the plurality of pixel electrodes through the planarization layer, the via-holes being arranged in a second grid pattern which is offset from the first grid pattern; providing a plurality of dummy via-holes which are respectively spaced apart from the plurality of via-holes; and forming a pixel-defining layer (PDL) on the planarization layer so as to cover the via-holes, the dummy via-holes, the non-light emission portion of the pixel electrodes; preparing a donor film on which a transfer layer is formed; aligning the transfer layer of the donor film and the light emission portion of the acceptor substrate so as to face each other; and transferring the transfer layer to the light emission portion by irradiating a laser onto the donor film.

The donor film may further comprise a light-to-heat-conversion (LTHC) layer.

The transfer layer may comprise a single layer or a plurality of layers comprising at least one layer selected from the group consisting of an organic emissive layer, an organic hole injection layer (HIL), an organic hole injection layer (HIL), an organic electron transport layer (ETL), and an organic electron injection layer (EIL).

The plurality of via-holes and the plurality of dummy holes may be formed in a mask operation.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
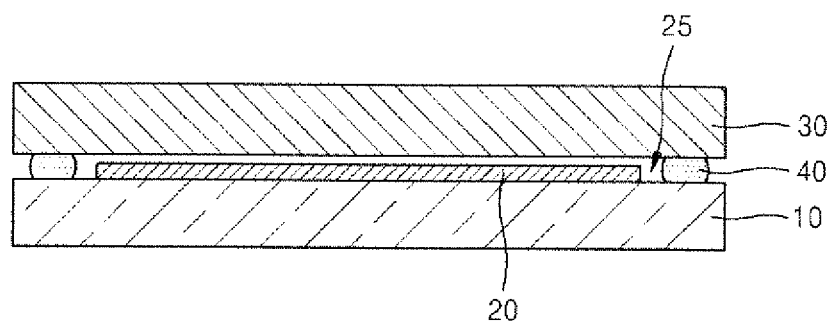
FIG. 1 is a schematic cross-sectional view illustrating an organic light-emitting display apparatus according to an embodiment of the present invention.

FIG. 1 is a schematic cross-sectional view illustrating an organic light-emitting display apparatus according to an embodiment of the present invention.

Referring to FIG. 1, the organic light-emitting display apparatus includes a substrate 10 and a display unit 20 disposed on the substrate 10.

Also, an encapsulation substrate 30 is disposed on the substrate 10 so as to encapsulate the display unit 20. The encapsulation substrate 30 prevents external air and water from penetrating into the display unit 20.

Edges of the substrate 10 and the encapsulation substrate 30 are attached using an encapsulation member 40 so that space 25 between the substrate 10 and the encapsulation substrate 30 is encapsulated. As will be described below, a moisture absorbent or a filling material may be located in the space 25.

Figure 2:
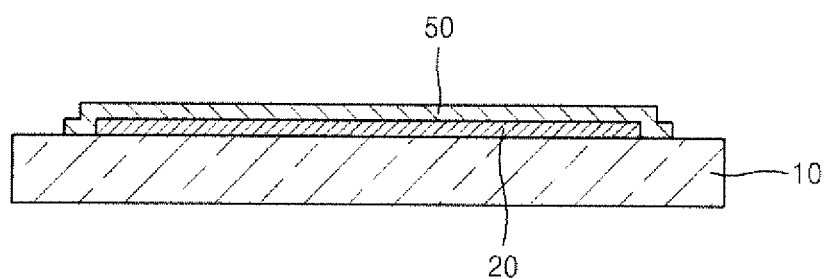
FIG. 2 is a schematic cross-sectional view illustrating an organic light-emitting display apparatus according to another embodiment of the present invention.

FIG. 2 is a schematic cross-sectional view illustrating an organic light-emitting display apparatus according to another embodiment of the present invention.

As illustrated in FIG. 2, instead of the encapsulation substrate 30, a thin encapsulation film 50 may be formed on a display unit 20 so as to protect the display unit 20 from external air or water. The encapsulation film 50 may have a structure in which a layer formed of an inorganic material, such as silicon oxide or silicon nitride, and a layer formed of an organic material, such as epoxy or polyimide, are alternately stacked, but the invention is not limited thereto.

Figure 3:
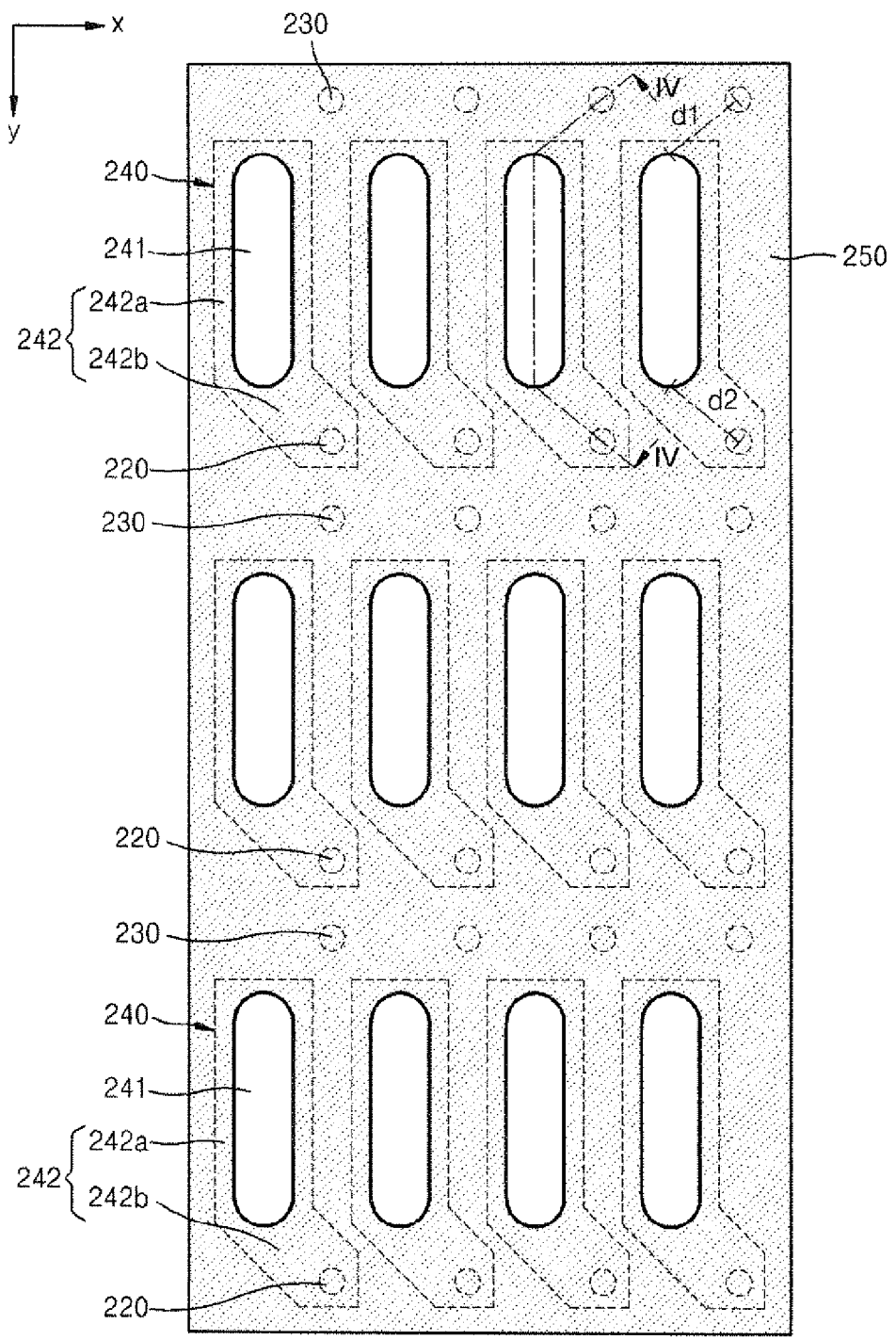
FIG. 3 is a detailed plan view illustrating a portion of a display unit illustrated in FIG. 1 or FIG. 2.
Figure 4:
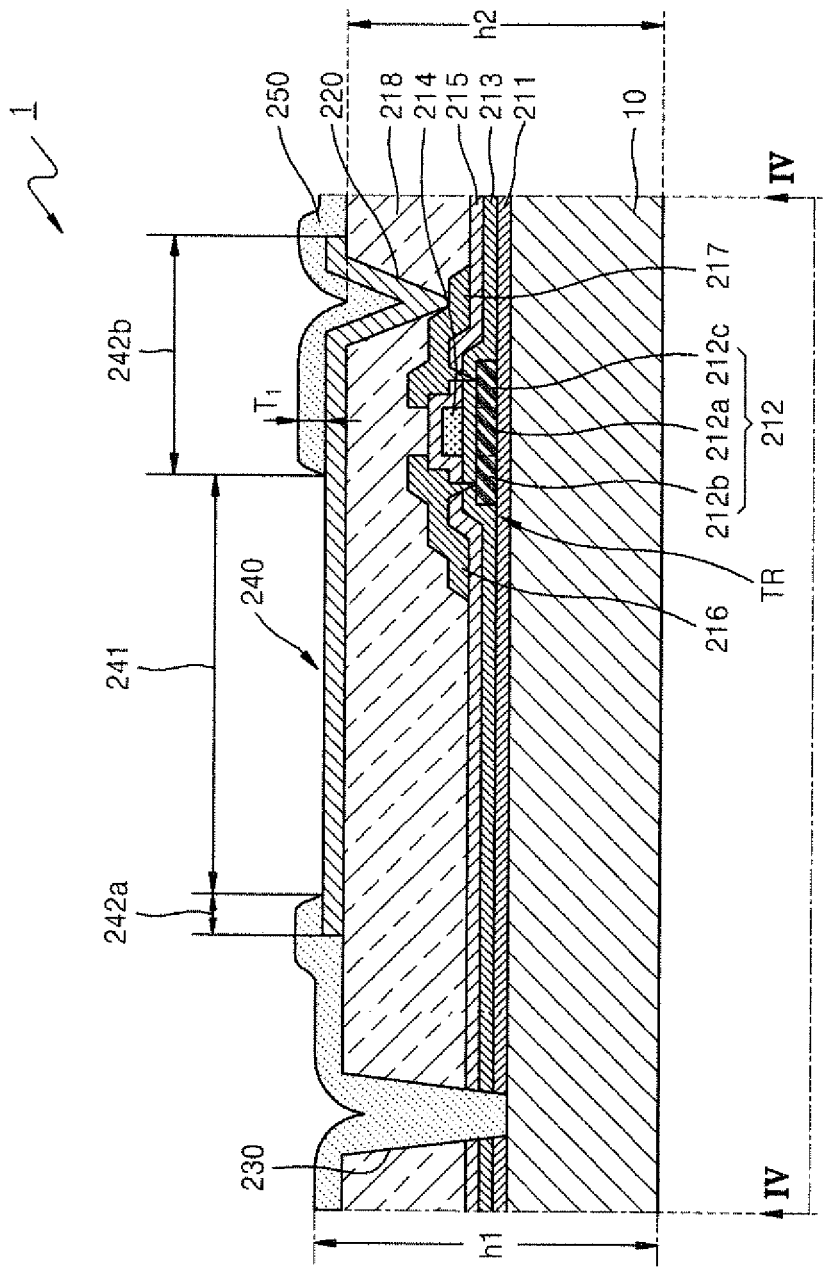
FIG. 4 is a cross-sectional view illustrating an organic light-emitting display apparatus taken along a line IV-IV of FIG. 3.
Figure 5:
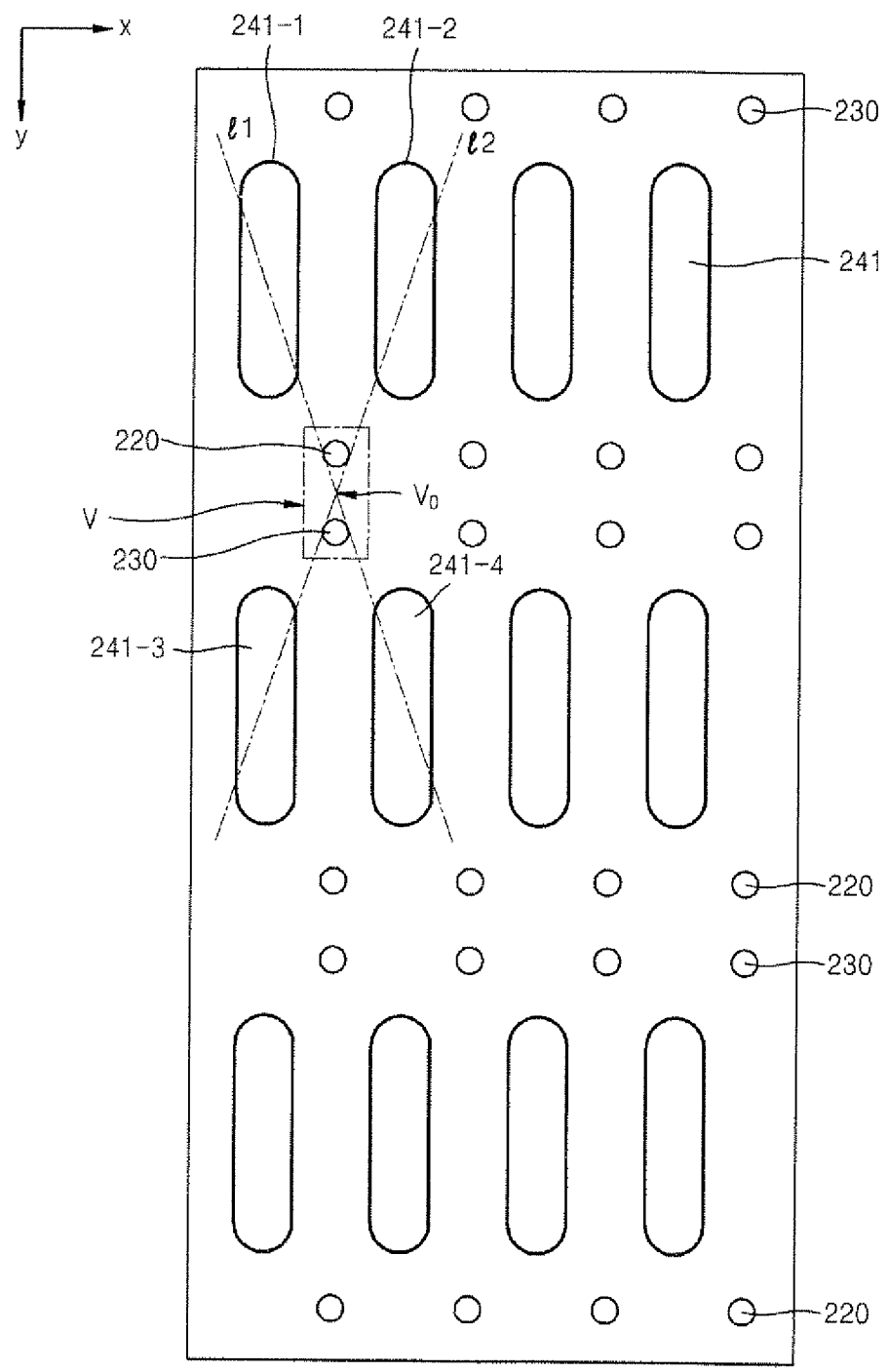
FIG. 5 is a schematic plan view illustrating arrangement relationships of light emission portions, via-holes, and dummy via-holes of FIG. 3.
Figure 6:
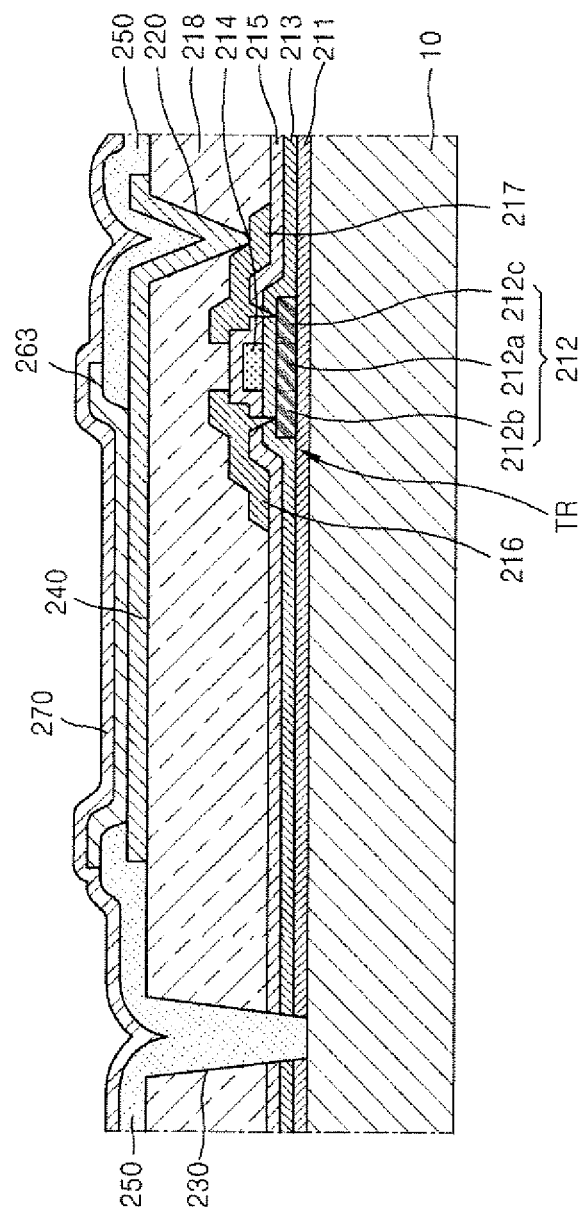
FIG. 6 is a schematic cross-sectional view illustrating an emissive layer and an opposite electrode disposed on a pixel electrode in the organic light-emitting display apparatus of FIG. 4.

FIG. 3 is a detailed plan view illustrating a portion of a display unit illustrated in FIG. 1 or FIG. 2; FIG. 4 is a cross-sectional view illustrating an organic light-emitting display apparatus taken along a line IV-IV of FIG. 3; FIG. 5 is a schematic plan view illustrating arrangement relationships of light emission portions, via-holes, and dummy via-holes of FIG. 3; and FIG. 6 is a schematic cross-sectional view illustrating an emissive layer and an opposite electrode disposed on a pixel electrode in the organic light-emitting display apparatus 1 of FIG. 4.

Referring to FIG. 4, the organic light-emitting display apparatus 1 includes a plurality of thin film transistors TR disposed on a substrate 10. The thin film transistors TR are electrically connected to a pixel electrode 240 via a via-hole 220.

The substrate 10 may be formed of a transparent glass material including $SiO_2$ as a main component. Alternatively, the substrate 10 may be formed of an opaque material or other materials such as a plastic material.

A buffer layer 211 may be disposed on an upper surface of the substrate 10. The thin film transistors TR may be disposed on the buffer layer 211.

The buffer layer 211 may prevent penetration of impurity elements from the substrate 10 into the thin film transistors TR, and may planarize a surface of the substrate 10. The buffer layer 211 may be formed of an inorganic material such as silicon oxide, silicon nitride, silicon oxynitride, aluminum oxide, aluminum nitride, titanium oxide or titanium nitride, an organic material such as a polyimide, polyester or an acryl, or a stack structure including inorganic and organic materials. The buffer layer 211 is not a requisite component, and may be omitted according to necessity.

In FIG. 4, for convenience of description, only one driving thin film transistor TR which is directly electrically connected to the pixel electrode 240 is shown. Also, although not shown in detail in FIG. 4, a switching thin film transistor (not shown) and a capacitor (not shown) may be further disposed on the substrate 10. Also, various wirings such as a scan line, a data line, and a driving line connected to the switching thin film transistor (not shown) and the capacitor (not shown) may be further disposed on the substrate 10.

The thin film transistor TR may include a semiconductor active layer 212, including a channel area 212a, a source area 212b and a drain area 212c. The semiconductor active layer 212 may be formed of an inorganic semiconductor such as an amorphous silicon or poly silicon, an organic semiconductor, or an oxide semiconductor.

A gate insulation layer 213 may be formed on the buffer layer 211 so as to cover the semiconductor active layer 212, and a gate electrode 214 may be formed on the gate insulation layer 213.

An interlayer insulation layer 215 may be formed on the gate insulation layer 213 so as to cover the gate electrode 214, and a source electrode 216 and a drain electrode 217 may be formed on the interlayer insulation layer 215 so as to contact the source area 212b and the drain area 212c, respectively, of the semiconductor active layer 212 via contact holes.

The organic light-emitting display apparatus 1 according to the current embodiment of the present invention is not limited to the structure of the thin film transistor TR illustrated in FIG. 4, and other thin film transistors with other structures may also be used. For example, while the thin film transistor TR illustrated in FIG. 4 has a top gate structure, a thin film transistor TR with a bottom gate structure in which the gate electrode 214 is disposed below the semiconductor active layer 212 may also be used. Furthermore, any applicable thin film transistor structures which may be applied to the organic light-emitting display apparatus 1 according to the current embodiment of the present invention may be used.

A planarization layer 218 is formed on the substrate 10 so as to cover the thin film transistor TR. The planarization layer 218 is formed so as to planarize a surface of the substrate 10 on which the plurality of thin film transistors TR are disposed, and may be formed of a single-layer or a multiple layer insulation layer. For example, at least one material selected from the group consisting of polyimide, polyamide, acrylic resin, benzocyclobutene, and phenolic resin may be used to form the planarization layer 218.

Although not shown in FIG. 4, a passivation layer (not shown) may be further disposed between the planarization layer 218, on one side, and the source electrode 216 and the drain electrode 217, on another side.

The via-hole 220 may be formed through the planarization layer 218 so as to expose the drain electrode 217 of the thin film transistor TR. The pixel electrode 240, formed in a predetermined pattern on the planarization layer 218, and the thin film transistor TR may be electrically connected to each other via the via-hole 220. Although the pixel electrode 240 is illustrated as being connected to the drain electrode 217 of the thin film transistor TR in FIG. 4, the embodiment of the present invention is not limited thereto. Alternatively, the pixel electrode 240 may be electrically connected to the source electrode 216 via the via-hole 220.

In addition to the via-hole 220 through which the thin film transistor TR and the pixel electrode 240 are electrically connected, a dummy via-hole 230 may also be formed in the planarization layer 218. The via-hole 220 and the dummy via-hole 230 may be formed in the same mask operation.

The dummy via-hole 230 includes a predetermined groove portion which is formed by etching a portion of the planarization layer 218 where the pixel electrode 240 is not formed. A portion of an organic insulation material of a pixel-defining layer (PDL) 250, which will be described below, is filled in the dummy via-hole 230, thereby reducing a total width of the PDL 250 which is to be formed on the planarization layer 218. On the other hand, the material of the PDL 250 is also partially filled not only in the dummy via-hole 230 but also in the above-described via-hole 220, and thus, the via-hole 220 may reduce the total width of the PDL 250, together with the dummy via-hole 230.

FIG. 4 illustrates that the dummy via-hole 230 passes not only through the planarization layer 218, but also all through the interlayer insulation layer 215, the gate insulation layer 218, and the buffer layer 211, but the embodiment of the present invention is not limited thereto. As long as a portion of the material of the PDL 250 is filled in the dummy via-hole 230, the dummy via-hole 230 may also have a structure formed by etching at least a portion of the planarization layer 218.

While a volume of one dummy via-hole 230 is illustrated as being greater than that of one via-hole 220, the embodiment of the present invention is not limited thereto. That is, the volume of the dummy via-hole 230 may be greater or smaller than that of the via-hole 220.

A plurality of pixel electrodes 240 are disposed on the planarization layer 218. Each of the pixel electrodes 240 includes a light emission portion 241 which is not covered by the PDL 250 and a non-light emission portion 242 which is covered by the PDL 250.

The via-hole 220 is disposed in the non-light emission portion 242 of the pixel electrode 240. In detail, the non-light emission portion 242 may be divided into a via-hole connection portion 242b connecting the light emission portion 241 and the via-hole 220 and a boundary portion 242a surrounding edges of the light emission portion 241. A plurality of via-hole connection portions 242b having the same patterns are illustrated in FIG. 3, but the embodiment of the present invention is not limited thereto.

Referring to FIG. 3, a distance d2 between a via-hole 220 and a boundary of the light emission portion 241 of the pixel electrode 240, and a distance d1 between a dummy via-hole 230 and a boundary of the light emission portion 241 of the pixel electrode 240, are set to be uniform. That is, the distances d2 and d1 are the same, and the via-hole 220 and the dummy via-hole 230 are designed so as to be as far as possible from an adjacent boundary of the light emission portion 241.

Referring to FIGS. 3 and 5, the light emission portion 241 of the pixel electrode 240 is formed on the planarization layer 218 so as to have a first grid pattern. That is, the plurality of light emission portions 241, which are not covered by the PDL 250, are patterned so as to be spaced apart from each other along a first axis x and a second axis y which cross each other perpendicularly. The pattern of the light emission portions 241 is formed so as not to overlap with patterns of the via-hole 220 and the dummy via-hole 230 described above.

The pattern of the via-hole 220 may be a second grid pattern which is formed by shifting from the first grid pattern by a predetermined distance with respect to the first axis x and the second axis y. That is, the first grid pattern and the second grid pattern are offset from each other.

The pattern of the dummy via-hole 230 may be a third grid pattern which is formed by shifting from the first grid pattern by a predetermined distance with respect to the first axis x and the second axis y. That is, the first grid pattern and the third grid pattern are offset from each other. In this regard, although patterns included along the first axis x of the second grid pattern of the via-hole 220 and the third grid pattern of the dummy via-hole 230 are shifted, patterns included along the second axis y may be in the same axis.

Referring to FIG. 5, among the plurality of via-holes 220 and the dummy via-holes 230, a via-hole area V including a pair of a via-hole 220 and a dummy via-hole 230 that are disposed close to each other is disposed at a furthest distance from boundaries of light emission portions 241-1, 241-2, 241-3, and 241-4 of adjacent pixel electrodes 240 around the via-hole area V.

A pattern of the via-hole area V may be a pattern which is formed by shifting from the first grid pattern of the light emission portion 241 by a predetermined distance with respect to the first axis x and the second axis y.

The via-hole area V may be regarded as being disposed between pairs of light emission portions 241-1 and 241-4 and 241-2 and 241-3 which are diagonally adjacent to each other around the via-hole area V. In other words, a center V0 of the via-hole area V may be located at a point of intersection between a first straight line l1 connecting a pair of diagonally adjacent light emission portions 241-1 and 241-4 and a second straight line l2 connecting a pair of diagonally adjacent light emission portions 241-2 and 241-3, which are disposed around each via-hole area V.

Referring to FIG. 4, the PDL 250 is formed on the planarization layer 218 on which the pixel electrode 240 is formed, thereby covering the via-holes 220, the dummy via-holes 230, and the non-light emission portions 242 of the pixel electrode 240.

The PDL 250 covers edges of the pixel electrode 240 by a predetermined thickness, and an organic layer 263, including an emissive layer which will be described below, is formed in a portion of the light emission portion 241 of the pixel electrode 240 which is exposed by the PDL 250 so as to define a pixel area from which light is emitted. Also, a distance between an end portion of the pixel electrode 240 and an opposite electrode 270 may be increased so as to thereby prevent arc generation at the end portion of the pixel electrode 240.

Referring to FIG. 6, the organic layer 263 including an emissive layer and the opposite electrode 270 are sequentially formed on the pixel electrode 240.

The organic layer 263, including an emissive layer, may be formed of a low molecular weight organic material or a polymer organic material. When a low molecular weight organic material is used, a hole injection layer (HIL), a hole transport layer (HTL), an electron transport layer (ETL), and an electron injection layer (EIL) may be stacked in a single or complex structure. Also, examples of organic materials are copper phthalocyanine (CuPc), N,N'-Di(naphthalene-1-yl)-N,N'-diphenyl-benzidine (NPB), and tris-8-hydroxyquinoline aluminum (Alq3).

When a polymer organic material is used, only an HTL may be included and directed toward the pixel electrode 240 from the emissive layer. In this regard, poly-(2,4)-ethylenedihydroxy thiophene (PEDOT) or polyaniline (PANI) may be used as the HTL.

The emissive layer may be formed in each red, green, and blue pixel, and the HIL, the HTL, the ETL and the EIL may be formed commonly so as to be applied to the red, green and blue pixels commonly.

The organic layer 263, including the emissive layer as described above, may be formed using various methods such as a vacuum deposition method, an inkjet printing method, a spin coating method, and a laser-induced thermal imaging (LITI) method. In particular, when the LITI method is used, an organic layer may be minutely patterned, and a high resolution may be obtained.

Figure 7:
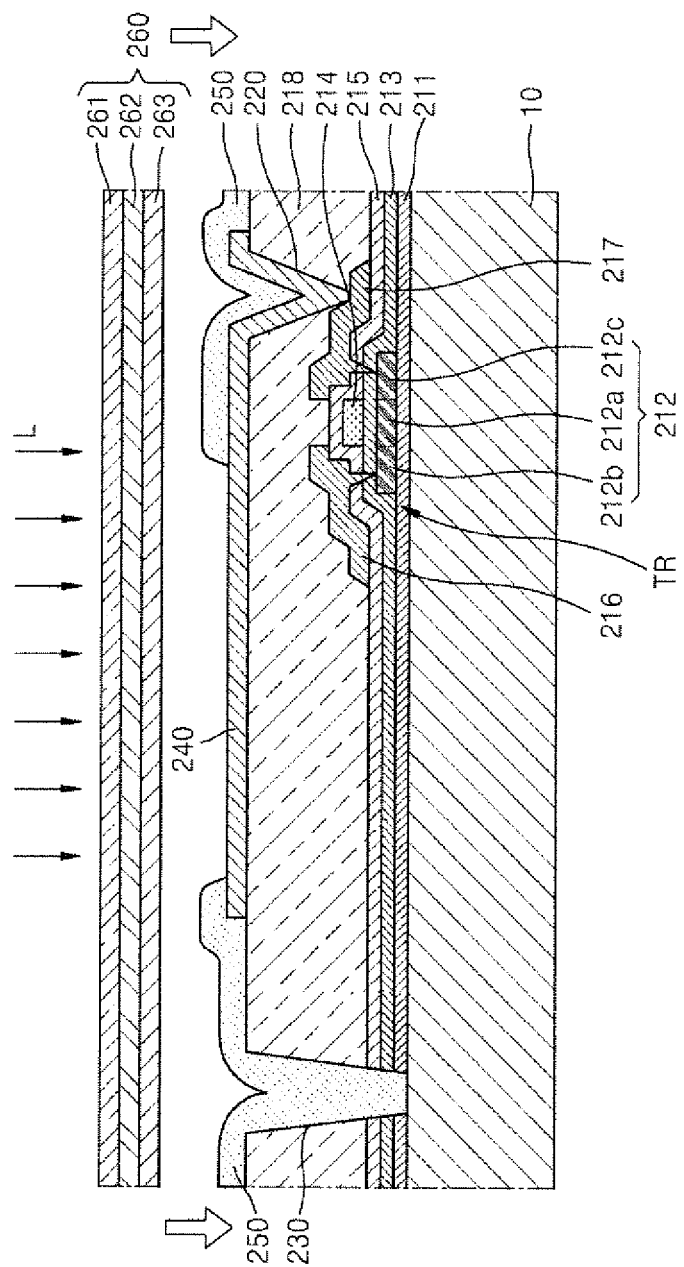
FIG. 7 is a schematic cross-sectional view illustrating a method of transferring an emissive layer on the pixel electrode of FIG. 4.
Figure 8:
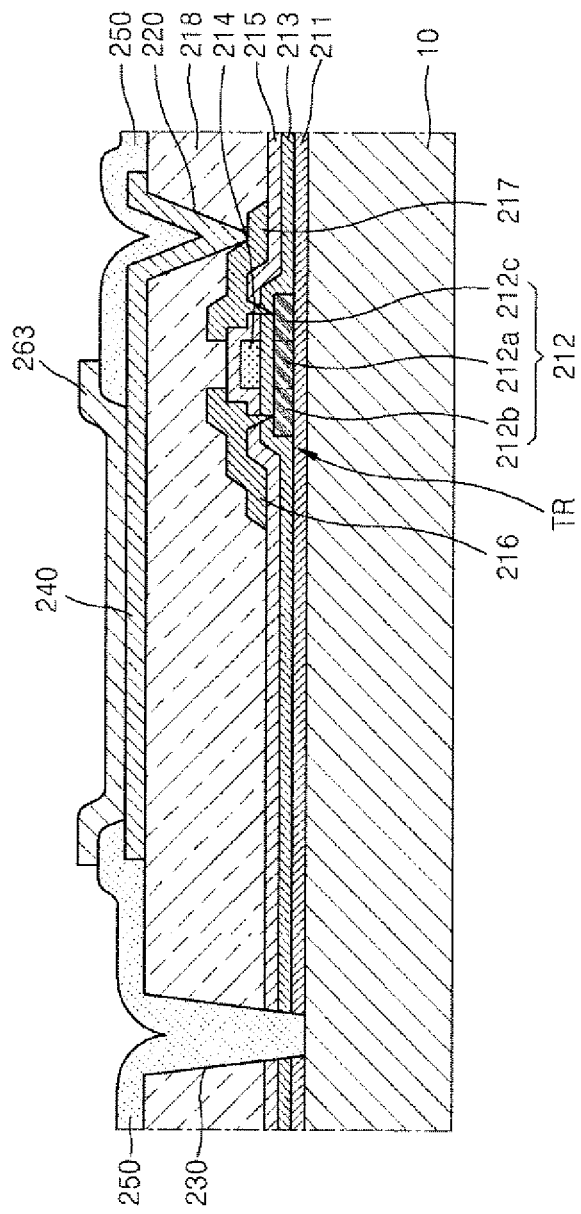
FIG. 8 is a schematic cross-sectional view illustrating the emissive layer transferred on the pixel electrode of FIG. 4.

FIG. 7 is a schematic cross-sectional view illustrating a method of transferring an emissive layer on the pixel electrode of FIG. 4; and FIG. 8 is a schematic cross-sectional view illustrating the emissive layer transferred on the pixel electrode of FIG. 4.

Referring to FIG. 7, a laser L is irradiated onto a predetermined area of a donor film 260. The donor film 260 includes a base film 261, a light-to-heat-conversion (LTHC) layer 262, and the organic layer 263, which is a transfer layer. The irradiated laser L is absorbed by the LTHC layer 262 of the donor film 260, and is converted into heat energy, and the converted heat energy reduces an adhesive force between the LTHC layer 262 and the organic layer 263, which is the transfer layer, so as to transfer the organic layer 263 onto the substrate 10, which is an acceptor substrate and on which the pixel electrode 240 is formed. As a result, as illustrated in FIG. 8, the pattern of the organic layer 263 is transferred onto the pixel electrode 240 of the acceptor substrate 10.

If the thickness of the PDL 250 surrounding the light emission portion 241 of the pixel electrode 240 is too thick, the organic layer 263, which is a light-emitting material, is not easily transferred at the boundary of the light emission portion 241 due to a high step formed at the boundary between the PDL 250 and the light emission portion 241. Accordingly, the PDL 250 may preferably have a thickness T1 (see FIG. 4) which is as thin as possible. However, it is difficult to form the PDL 250, which is usually formed of an organic material, so as to have a thin thickness.

However, according to the organic light-emitting display apparatus 1 of the current embodiment of the present invention, with respect to the dummy via-hole 230 in which an etching groove with a predetermined volume is formed in the planarization layer 218, the material of the PDL 250 is filled in the dummy via-hole 230 so that the total thickness T1 of the PDL 250 may be reduced.

Figure 9:
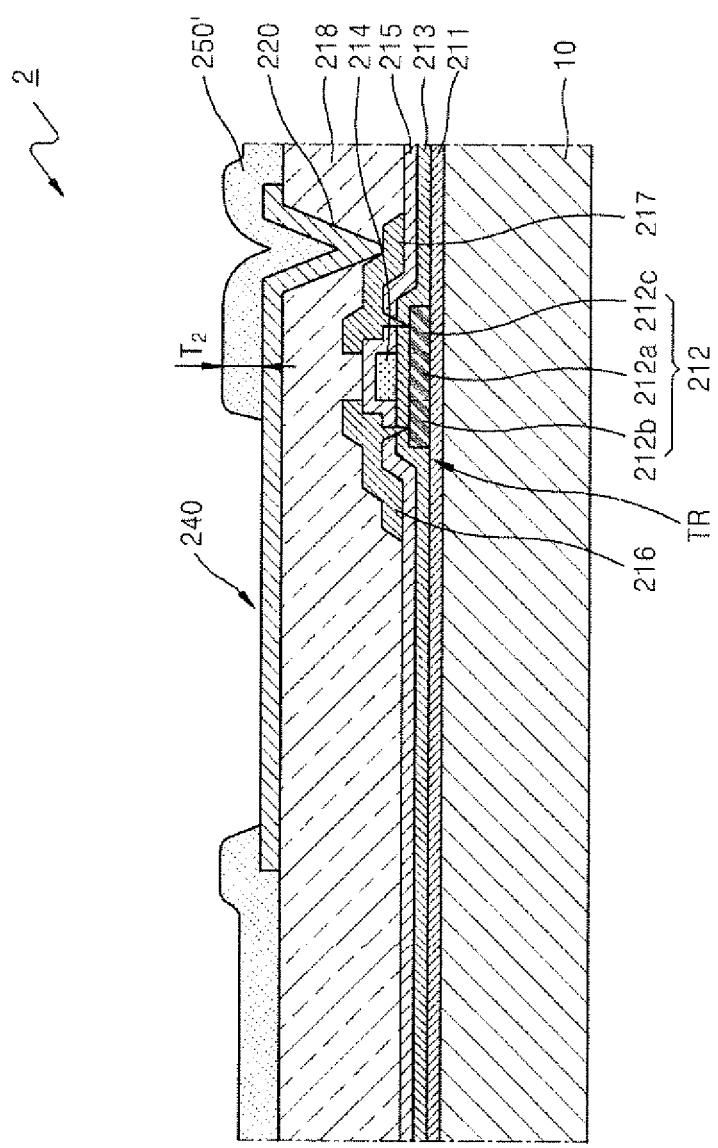
FIG. 9 is a schematic cross-sectional view illustrating an organic light-emitting display apparatus which is a comparative example of the organic light-emitting display apparatus of FIG. 4.

FIG. 9 is a schematic cross-sectional view illustrating an organic light-emitting display apparatus which is a comparative example of the organic light-emitting display apparatus of FIG. 4. Referring to FIG. 9, in the organic light-emitting display apparatus 2 in which no dummy via-hole is formed, a thickness T2 of a PDL 250' is greater than a thickness T1 of the PDL 250 of the organic light-emitting display apparatus 1 of FIG. 4 according to the embodiment of the present invention.

According to an embodiment of the present invention, the thickness of the PDL 250 may be from 500 Å to 2000 Å. If the thickness of the PDL 250 is less than 500 Å, the PDL 250 is too thin to define a pixel area; if the thickness of the PDL 250 is greater than 2000 Å, due to a step formed at the boundary between the PDL 250 and the light emission portion 241, an emissive layer may not be easily transferred using, for example, an LTHC method.

Also, when forming the PDL 250 having a thin thickness, if the via-hole 220 and the dummy via-hole 230 are too close to the boundary of the light emission portion 241 of the pixel electrode 240, the material of the PDL 250 is filled in a groove portion formed by the via-hole 220 and the dummy via-hole 230, and thus, the PDL 250 formed at the boundary of the pixel electrode 240 may not maintain its thickness and may collapse toward the via-hole 220. Then, the boundary between the pixel electrode 240 and the light emission portion 241 becomes obscure. As a result, when forming an emissive layer pattern by using the above-described LTHC method, the boundary of the emissive layer pattern collapses and display quality is deteriorated thereby.

However, referring to FIG. 5, in the organic light-emitting display apparatus 1 according to the current embodiment of the present invention, because the via-hole areas V, each including one pair of the via-hole 220 and the dummy via-hole 230 which are close to each other, are disposed as far as possible from the adjacent light emission portions 241-1, 241-2, 241-3, and 241-4, even if the PDL 250 has collapsed in the via-hole 220 and the dummy via-hole 230, the PDL 250 may maintain its thickness at boundaries of the light emission portions 241-1, 241-2, 241-3, and 241-4, and thus, the form of a light emission area may be maintained. Accordingly, when forming a pattern using an LTHC method, a boundary of the emissive layer pattern is maintained clearly, and the total planarity of pixels are maintained, thereby improving display quality.

Referring to FIG. 4, because the PDL 250 is thin, a height h2 from a lower surface of the substrate 10 to the PDL 250, formed on the via-hole 220 and the dummy via-hole 230, is lower than a height h1 from the lower surface of the substrate 10 to a surface of the pixel electrode 240 formed in the light emission portion 241. This is because the thin PDL 250 cannot sufficiently fill steps formed in the via-hole 220 and the dummy via-hole 230.

However, according to the current embodiment of the present invention, as the via-hole 220 and the dummy via-hole 230 are spaced apart sufficiently from the boundary of the light emission portion 241 of the pixel electrode 240, although the thickness of the PDL 250 formed on the via-hole 220 and the dummy via-hole 230 may collapse, the thickness of the PDL 250 at the boundary of the light emission portion 241 is maintained.

In the organic light-emitting display apparatus 1 according to the embodiment of the present invention, the pixel electrode 240 may function as an anode, and the opposite electrode 270 may function as a cathode. However, the organic light-emitting display apparatus is not limited thereto, and the polarities of the pixel electrode 240 and the opposite electrode 270 may be exchanged.

According to an embodiment of the present invention, the pixel electrode 240 may be a reflective electrode, and the opposite electrode 270 may be a transparent electrode. Thus, the display unit 20 may be a top emission type display unit in which an image is formed toward the opposite electrode 270.

To this end, the pixel electrode 240 may include a reflection layer formed of Ag, Mg, Al, Pt, Pd, Au, Ni, Nd, Ir, Cr, Li, Ca or a compound of these, and ITO, IZO, ZnO, or $In_2O_3$ having a high work function. Also, the opposite electrode 260 may be formed of a metal having a small work function, such as Ag, Mg, Al, Pt, Pd, Au, Ni, Nd, Ir, Cr, Li, Ca, or an alloy of these.

However, the embodiment of the present invention is not limited thereto, and the pixel electrode 240 may be a transparent electrode. In this case, the above-described pixel electrode 240 may be formed of TO, IZO, ZnO, or $In_2O_3$ having a high work function, and not a reflection layer.

According to the organic light-emitting display apparatuses of the embodiments of the present invention, the following effects may be obtained.

First, even when the thickness of a thin PDL near a via-hole collapses, the PDL at a boundary of a light emission portion may maintain its original thickness.

Second, as the thickness of the PDL at the boundary of the light emission portion is maintained, a light emission area may be accurately defined.

Third, by forming a thin PDL, the display quality of the organic light-emitting display apparatus may be improved when forming an emissive layer pattern using a laser-induced thermal imaging (LITI) method.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
    a planarization layer covering a plurality of thin film transistors formed on a substrate;
    a plurality of pixel electrodes, each comprising a light emission portion and a non-light emission portion, wherein the light emission portions ref the pixel electrodes are arranged on the planarization layer in a first grid pattern;
    a plurality of via-holes arranged in a second grid pattern which is offset from the first grid pattern, each via-hole connecting a respective one of the plurality of thin film transistors and a respective one of the plurality of pixel electrodes through the planarization layer;
    a plurality of dummy via-holes respectively spaced apart from the plurality of via-holes;
    a pixel-defining layer (PDL) formed on the planarization layer so as to cover the via-holes, the dummy via-holes, and the non-light emission portion of the pixel electrodes;
    an organic layer disposed on the light emission portion and including an emissive layer; and
    an opposite electrode disposed on the organic layer.

2. The organic light-emitting display apparatus of claim 1, wherein the dummy via-holes are disposed outside an area where the pixel electrodes are formed.

3. The organic light-emitting display apparatus of claim 1, wherein the dummy via-holes are arranged in a third grid pattern which is offset from the first grid pattern.

4. The organic light-emitting display apparatus of chair 3, wherein a first axis of the third grid pattern and a first axis of the second grid pattern are formed on a same axis, and a second axis of the third grid pattern and a second axis of the second grid pattern are offset.

5. The organic light-emitting display apparatus of claim 1, wherein the dummy via-holes can comprise a groove portion which is etched in the planarization layer.

6. The organic light-emitting display apparatus of claim 1, wherein the via-holes are disposed in the non-light emission portion of the pixel electrodes.

7. The organic light emitting display apparatus of claim 6, wherein a height, with respect to the substrate, of a surface of the pixel-defining layer formed on the via-holes is lower than a height, with respect to the substrate, of a surface of the pixel electrodes formed in the light emission portion.

8. The organic light-emitting display apparatus of claim 1, wherein the pixel-defining layer comprises an organic insulation material.

9. The organic light-emitting display apparatus of claim 1, wherein a thickness of the pixel-defining layer is in a range of 500 Å to 2000 Å.

10. The organic light-emitting display apparatus of claim 1, wherein the pixel-defining layer is substantially planar except in an area covering the via-holes and the dummy via-holes.

11. The organic light-emitting display apparatus of claim 1, wherein respective distances between the light emission portion and the via-holes, and between the light emission portion and the dummy via-holes which are most adjacent to the light emission portion, are substantially the same.

12. An organic light-emitting display apparatus, comprising:
    a planarization layer covering a plurality of thin film transistors;

a plurality of via-holes comprising a groove portion which is formed by etching the planarization layer and a plurality of dummy via-holes which are spaced apart from the via-holes;

a plurality of pixel electrodes, each comprising a light emission portion and a non-light emission portion, wherein the pixel electrodes are connected to one of the plurality of thin film transistors via the via-holes, and a via-hole area including a pair of via-hole and a dummy via-hole which are closest to each other is disposed at a distance furthest away from the light emission portion of each of the plurality of pixel electrodes which are adjacent to the via-hole area;

a pixel-defining layer formed on the planarization layer so as to cover the via-holes, the dummy via-holes, and the non-light emission portion of the pixel electrodes;

an organic layer disposed on the light emission portion and comprising an emissive layer; and an opposite electrode disposed on the organic layer.

13. The organic light-emitting display apparatus of claim 12, wherein the light emission portions of the pixel electrodes are arranged in a first grid pattern on the planarization layer, and the via-hole area has an arrangement which is offset from the first grid pattern.

14. The organic light-emitting display apparatus of claim 12, wherein the via-hole area is disposed between the light emission portions which are diagonally adjacent to one another.

15. The organic light-emitting display apparatus of claim 14, wherein a center of the via-hole area is disposed at a point of intersection between the diagonally adjacent light emission portions.

16. The organic light-emitting display apparatus of claim 12, wherein the via-holes are disposed in the non-light emission portions of the pixel electrodes, and the dummy via-holes are disposed outside an area where the pixel electrodes are disposed.

17. A method of manufacturing an organic light-emitting display apparatus, the method comprising the steps of:

preparing an acceptor substrate on which a planarization layer covering a plurality of thin film transistors is disposed;

providing a plurality of pixel electrodes, each comprising a light emission portion and a non-light emission portion, wherein the light emission portions of the pixel electrodes are arranged on the planarization layer in a first grid pattern;

providing a plurality of via-holes, each connecting one of the plurality of thin film transistors and one of the plurality of pixel electrodes through the planarization layer, the via-holes being arranged in a second grid pattern which is offset from the first grid pattern;

providing a plurality of dummy via-holes which are respectively spaced apart from the plurality of via-holes;

providing a pixel-defining layer (PDL) formed on the planarization layer so as to cover the via-holes, the dummy via-holes, and the non-light emission portion of the pixel electrodes;

preparing a donor film on which a transfer layer is formed;

aligning the transfer layer of the donor film and the light emission portion of the acceptor substrate so as to face each other; and transferring the transfer layer to the light emission portion by irradiating a laser onto the donor film.

18. The method of claim 17, wherein the donor film further comprises a light-to-heat-conversion (LTHC) layer.

19. The method of claim 17, wherein the transfer layer comprises at least one layer selected from the group consisting of an organic emissive layer, an organic hole injection layer (HIL), an organic hole injection layer (HIL), an organic electron transport layer (ETL), and an organic electron injection layer (EIL).

20. The method of claim 19, wherein said at least one layer comprises a plurality of layers.

21. The method of claim 17, wherein the plurality of via-holes and the plurality of dummy via-holes are formed in a mask operation.

* * * * *